United States Patent [19]
Watanabe

[11] Patent Number: 5,480,815
[45] Date of Patent: Jan. 2, 1996

[54] METHOD OF MANUFACTURING A BIOPOLAR TRANSISTOR IN WHICH AN EMITTER REGION IS FORMED BY IMPURITIES SUPPLIED FROM DOUBLE LAYERED POLYSILICON

[75] Inventor: Takeshi Watanabe, Tokyo, Japan

[73] Assignee: NEC Corporation, Tokyo, Japan

[21] Appl. No.: 108,291

[22] Filed: Aug. 19, 1993

[30] Foreign Application Priority Data

Aug. 19, 1992 [JP] Japan .................. 4-219876

[51] Int. Cl.⁶ .................................. H01L 21/328
[52] U.S. Cl. ................ 437/31; 437/193; 437/195
[58] Field of Search .................... 437/31, 32, 49, 437/50, 51, 189, 190, 193, 195, 33, 191; 257/700, 748, 750, 756, 781, 786, 920, 587; 148/DIG. 9, DIG. 10, DIG. 11

[56] References Cited

U.S. PATENT DOCUMENTS

| | | | |
|---|---|---|---|
| 4,800,176 | 1/1989 | Kakumu et al. | 457/193 |
| 4,996,581 | 2/1991 | Hamasaki | 437/31 |
| 5,010,039 | 4/1991 | Ku et al. | 437/31 |
| 5,272,357 | 12/1993 | Morishita | 257/587 |
| 5,302,535 | 4/1994 | Imaia et al. | 437/31 |

OTHER PUBLICATIONS

"BSA Technology for Sub-100nm Deep Base Bipolar Transistors", *IEEE*, 1987, by H. Takemura et al., pp. 375–378.
Silicon Processing for the VLSI Era, Stanley Wolf 91 (1990).

Primary Examiner—George Fourson
Assistant Examiner—Brian K. Dutton
Attorney, Agent, or Firm—Young & Thompson

[57] ABSTRACT

A process of fabricating a bipolar transistor, particularly forming a very shallow, uniform emitter diffused-layer for the purpose of realizing a higher speed of the device without need of prolongating LSI fabrication term. In the process of building a bipolar transistor on a n-type semiconductor substrate, after forming the p-type base region of the bipolar transistor, an insulating film is formed, in an region of which where an emitter is to be formed a contact hole is opened. In the next processing step, polysilicon films of different arsenic contents are stacked on top of one the other, followed by thermal diffusion of arsenic, to form an emitter region in the base region. The first polysilicon film has a low arsenic content than the second polysilicon film, and a silicon dioxide film of up to 5 nm in thickness is interposed between the polysilicon films.

11 Claims, 4 Drawing Sheets

METHOD OF MANUFACTURING A BIOPOLAR TRANSISTOR IN WHICH AN EMITTER REGION IS FORMED BY IMPURITIES SUPPLIED FROM DOUBLE LAYERED POLYSILICON

BACKGROUND OF THE INVENTION

This invention relates to a process of fabricating a semiconductor device, and more particularly to a method of forming a very shallow emitter diffused-layer of a bipolar transistor.

Bipolar LSIs are, because of their high speed characteristic, used mainly as the central arithemetic/logic elements of the super computer, and recently further required, as the performance becomes higher and higher, to higher speeds.

Such an ultrahigh-speed bipolar transistor is of self-aligned structure in which the emitter and base are formed by the self-aligned technique. An example of this is reported in the Technical Digest of the International Electron Device Meeting, pp. 375–378.

This conventional process of fabricating the emitter diffused-layer described in this report will be set forth. In a transistor-forming region isolated by a field oxide layer, a $p^{++}$ type base region is formed. Over the whole surface of an n type semiconductor substrate with p type polysilicon and silicon dioxide films produced and patterned, then a $p^-$ type base region is formed by depositing a BSG film, followed by thermal treatment to diffuse the boron from the BSG film into the substrate. The BSG film is etched by the reactive ion etching (RIE) technique to leave a sidewall insulating-film so that an emitter-formed region is opened. On the entire surface, an impurity-free polysilicon film is deposited by chemical vapor deposition (CVD), implanted with arsenic, and patterned by the combined use of photolithography and dry etching. The subsequent rapid thermal annealing (RTA) is carried out to diffuse arsenic from the $n^+$ type polysilicon film and boron from the sidewall insulating-film, so that $n^+$ type emitter region and $p^+$ type base region are formed, respectively. Thus a transistor is completed. In the last step, a silicon dioxide film is formed over entire substrate. Then, contact holes for metallic electrode interconnection are opened by RIE technique. Next, a titanium nitride film and an aluminium film are deposited by the sputtering technique and then patterned to fabricate an emitter electrode constructed of the aluminium and the underlying titanium nitride films.

This prior art process of producing an emitter diffused-layer has defects which will be described under. The polysilicon film is deposited without doping impurities. Then, the arsenic ions are implanted into the film to make it good conductor. However, according to the ion implantation, the arsenic ions are implanted vertically toward the substrate. Therefore, the ions are well implanted into a level portion of the polysilicon film, for example, formed on the $p^+$ type polysilicon film, the silicon dioxide film or the $p^-$ type base region. To the contrary, the ions are poorly implanted into a slant portion of the film, for example, formed on the sidewall insulating-film. Accordingly, the film is unevenly doped with the arsenic ions. Consequently, when the impurities are diffused from the polysilicon film to form the emitter region, there generates a problem that an impurity concentration of the emitter region does not become uniform. That is, the impurity concentration of the polysilicon film near the sidewall insulating-film is smaller than that of the film near a central portion of an emitter opening. If the emitter region with uneven impurity concentration is formed, an effective junction area between the emitter and the base regions becomes small. This problem leads to lower operation speed, and is the cause of the dispersion of the element characteristics. These have been problems principally insoluble as far as ion implantation is used.

The present inventor studied a combined technique of growing polysilicon film and simultaneously doping arsenic, the product by which is referred to as arsenic-polysilicon film hereinafter. An arsenic-polysilicon film is grown by the deposition with a mixed gas of $SiH_4$ and $AsH_3$ heated at 550° to 600° C. and in vacua (about 0.1 Torr). Using a transistor fabricated by growing an arsenic-polysilicon film of 150 to 200 nm thick, a desired operation speed could be obtained.

A new problem however occurred which will be described below. When arsenic is contained in the arsenic-polysilicon film at concentrations of $10^{21}$ $cm^{-3}$ or higher to form an emitter region having uniform impurity concentration, (A) A film-forming rate was 0.5 or less nm/min, and it took 300 to 400 minutes, therefore not practical;

(B) In the process of growing an insulating film on the arsenic-polysilicon film and opening therein holes for metallic electrode connection, dry etching by RIE technique was studied with various gases. No adequate selectivity was obtained, with the result that the arsenic-polysilicon film was etched. In many cases alloy spiking occurred when the metallic electrode was deposited, and leakage from the transistors was observed.

SUMMARY OF THE INVENTION

Therefore, it is an object of the present invention to provide a process of fabricating a bipolar transistor performing high speed operation without an extended fabrication time.

In addition, it is another object of the present invention to provide a process of fabricating a bipolar transistor preforming high speed operation avoiding the alloy spiking phenomenon.

A first process of fabricating a semiconductor device according to the present invention comprises a step of forming a base region of the second conductivity type in a collector region of the first conductivity type; a step of forming a first polysilicon film on a major surface of said base region with addition of an impurity of the first conductivity type; a step of forming a silicon dioxide film on a major surface of said first polysilicon film; a step of forming a second polysilicon film of the first conductivity type on a major surface of said silicon dioxide film, impurity concentration of the second polysilicon film being smaller than that of the first polysilicon film; and a step of forming an emitter region of said first conductivity type by diffusing an impurity of the first conductivity type from said first polysilicon film into said base region.

A second process of fabricating a semiconductor device according to the present invention comprises a step of forming a base region of the second conductivity type in a collector region of the first conductivity type; a step of forming a first polysilicon film of the first conductivity type on a major surface of said base region; a step of forming a silicon dioxide film on a major surface of said first polysilicon film; a step of forming a second polysilicon film of the first conductivity type lower in impurity concentration than said first polysilicon film on a major surface of said silicon dioxide film; a step of forming an emitter region of the first conductivity type by diffusing an impurity of the first conductivity type from said first polysilicon film into said base region; a step of forming an insulating film covering said second polysilicon film; and a step of, after opening a hole in said insulating film, forming an emitter electrode filling said hole and connected to said second polysilicon film.

In the first process of fabricating a semiconductor device according to the present invention, in the place of a polysilicon film of the first conductivity type, it is built on the base region, which is constructed of the first and second polysilicon films, and the silicon dioxide film interposed between them. Therefore, sufficient impurity of the first conductivity type for forming the emitter region can be diffused from the first polysilicon film, and thereby an emitter region having a uniform distribution of impurity concentration can be formed at an emitter-hole bottom in the base region. Therefore, an effective area of a base-emitter junction can be enhanced. Because the second polysilicon film is formed with lower impurity concentration, this procedure can be accomplished in a shortened time as compared with the prior art. Besides the silicon dioxide film between the first and second polysilicon films prevents impurities in them from interdiffusing between them, with the results of obtaining simultaneously the above-mentioned effects and permitting the first and second polysilicon films to play their roles at most. The silicon dioxide film between them, if formed to a small thickness, would allow current amount necessary for driving the transistor to pass through it in prevention of the interdiffusion of impurities between the first and second polysilicon films.

In the second process of fabricating a semiconductor device according to the present invention, in the place of a polysilicon film, it is built on the base region, which is constructed of the first and second polysilicon films, and the silicon dioxide film interposed between them. Therefore, sufficient impurity for forming the emitter region can be diffused from the first polysilicon film, which in turn enables to form an emitter region having a uniform distribution of impurity concentration, at the emitter-hole bottom in the base region. Therefore, an operation speed of the transistor can be increased. The second polysilicon film is lower in impurity concentration than the first polysilicon film, which makes it possible to open the hole in the insulating film covering the second polysilicon film, at a sufficient etch selectivity in respect to the insulating film. This allows to form the emitter electrode without both etching the polysilicon film and producing any alloy spiking. Besides the silicon dioxide film between the first and second polysilicon films prevents impurities in them from interdiffusing between them, with the result of obtaining simultaneously the above-mentioned effects and permitting them to play their roles at most. The silicon dioxide film between them, if formed to a small thickness, would allow current amount necessary for driving the transistor to pass through it in prevention of the interdiffusion of impurities between the first and second polysilicon films.

The present invention is achieved by following details. That is, polysilicon film for forming a emitter region has two roles. One is a diffusion source to form the emitter region. And another is a film for preventing alloy spiking when a metallic emitter electrode is fixed. When the emitter region is formed by diffusing arsenic from the polysilicon film, it is required that the impurity concentration of the film is more than $1 \times 10^{21}$ $cm^{-3}$. To the contrary, when a metallic emitter electrode is fixed, it is required that the impurity concentration of the film is approximately $5 \times 10^{19}$ $cm^{-3}$ to $5 \times 10^{20}$ $cm^{-3}$ from a viewpoint of electric resistance. Accordingly, the present inventor thought that the two roles of the polysilicon film should be shared by different two films, respectively. In conclusion, the two polysilicon films doped by impurities and having different impurity concentrations from each other are stacked and used for the transistor. In addition, what is important thing is that a thin silicon dioxide film having a thickness less than 5 nm (5 nanometer) is inserted between the two polysilicon films having different impurity densities. In general, a heat treatment is required for diffusing impurities from the polysilicon film to form the emitter diffusion region. If the doped impurities is diffused between the two polysilicon films during the heat treatment, impurity concentration of the polysilicon film having a lower impurity concentration comparing with another film is increased. The phenomenon results in lowering etching selectivity when a reactive ion etching is performed to form an opening for fixing the metallic emitter electrode for the polysilicon film. Therefore, it is dispensable to insert the thin silicon dioxide film between the two polysilicon films serving as a diffusion barrier of the doped impurities. In addition, the thickness of the thin silicon dioxide film is preferable to select equal to or less than 5 nm (5 nanometer).

BRIEF DESCRIPTION OF THE DRAWINGS

The above-mentioned and other objects, features and advantages of the present invention will become more apparent from the following description taken in conjunction with the accompanying drawings, in which.

DETAILED DESCRIPTION OF THE PREFERRED EMBODIMENT

The present invention will be described with reference to the accompanying drawing hereinafter.

Figure 1:
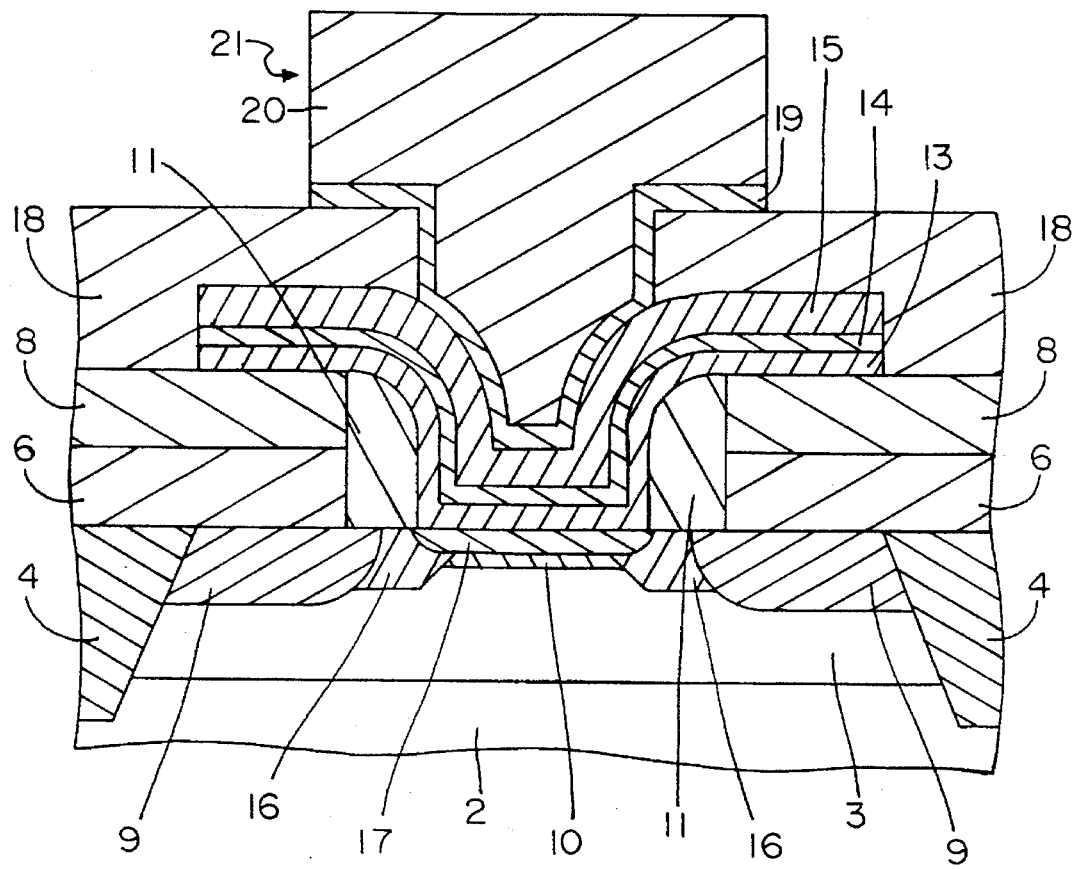
FIG. 1 is a partial fragmentary sectional view of the bipolar transistor according to an embodiment of the present invention.

Referring to FIG. 1, an $N^+$ type polysilicon film 15 and $N^{++}$ type polysilicon film 13 are formed between an $N^+$ type emitter region 17 and an emitter electrode 21. Moreover, a silicon oxide film 14 is inserted between the two polysilicon films 13 and 15. The $N^+$ type emitter region 17 is surrounded by $P^-$ type and $P^+$ type base regions 10 and 16. In the embodiment, the emitter region 17 is formed in a manner which the emitter region 17 keeps a uniform diffusion depth and keeps wide junction area between the base regions 10 and 16. The $P^+$ type base region 16 is connected to P type polysilicon electrode 6 via the circular-shaped $P^{++}$ type base region 9. Further, an $N^+$ type buried layer 2 and $N^-$ type epitaxial layer 3 serve as N type collector region.

Next, a process of fabricating the transistor according to the present invention will be described. FIG. 1 shows only a major portion of the transistor. However, in FIGS. 2(a) to 2(f), processes of fabricating other elements such as a collector electrode will also be explained.

A polysilicon film is deposited on a major surface of the semiconductor substrate 1 by CVD technique. Into this polysilicon film, p type and n type impurities are selectively introduced by ion implantation. Each region where p type and n type impurities, respectively, are introduced serves as a p type polysilicon electrode 6 connected to the p type base region 9 and an n type polysilicon electrode 7 connected to the n type collector region 5, respectively. Then, a silicon dioxide film 8 is formed over the surface of the polysilicon film.

The silicon dioxide film 8 and the polysilicon film are patterned to fabricate separate p type and n type polysilicon electrodes 6 and 7. In the area where p type impurity is introduced, a hole is opened for exposing the $n^-$ type epitaxial layer 3, followed by thermal treatment causing diffusion of the p type impurity from the p type polysilicon electrode 6, thus a $p^{++}$ type base region 9 being formed. Subsequently a BSG film is deposited over the entire surface, and then thermal treatment is carried out to diffuse boron from the BSG film into the $n^-$ type epitaxial layer 3, thus a $p^-$ type base region 10 being formed. The BSG film is patterned by RIE technique to form an insulating sidewall-film 11 on the sidewalls of the holes. And then, an emitter opening 12 is formed.

Figure 2A:
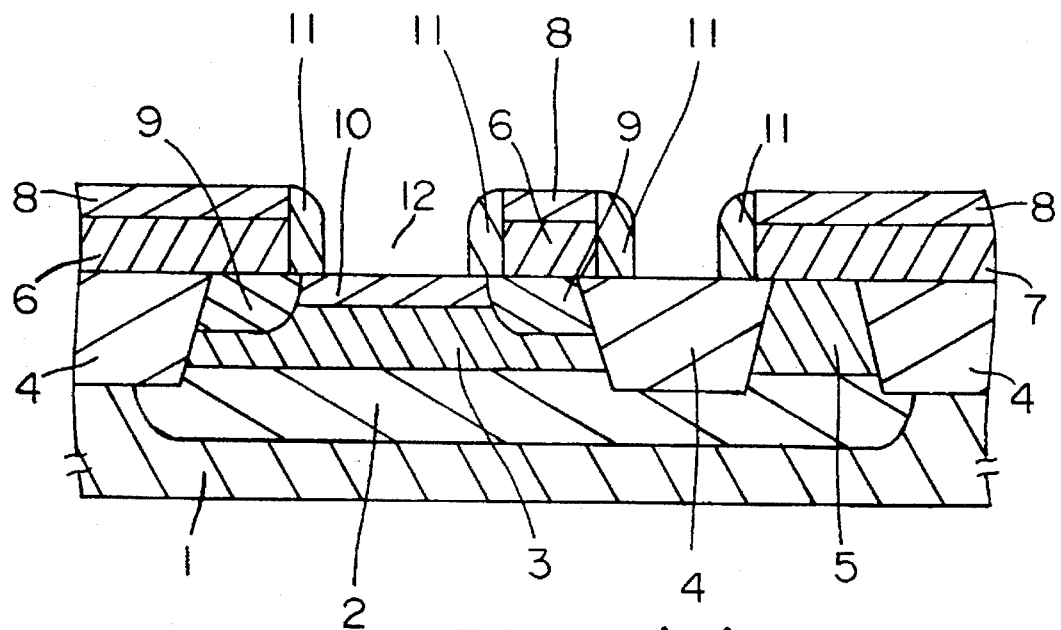
FIGS. 2(a) to 2(f) are sectional views arranged in order to explain the process of fabricating a bipolar transistor according to the embodiment of the invention.
Figure 2B:
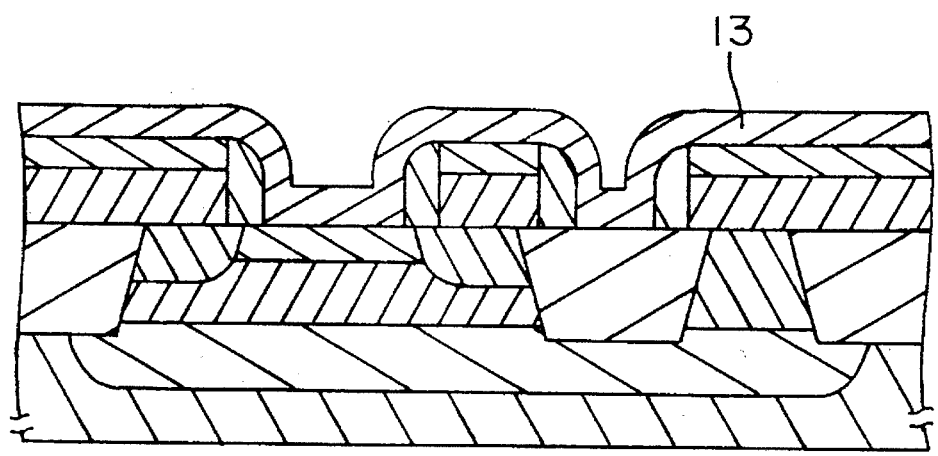

In the next step, as shown in FIG. 2(b), an $n^{++}$ type polysilicon film 13 is formed over the entire surface by CVD technique with the addition of n type impurity such as arsenic. This deposition is performed with a mixed gas of $SiH_4$ and $AsH_3$ heated at 550° to 600° C. at an operating pressure of about 1 Torr. The thickness of film 13 is 10 nm. The impurity concentration in the $n^{++}$ type polysilicon film 13 is set, for example, to $10^{21}$ atoms/cm$^3$ or more.

Figure 2C:
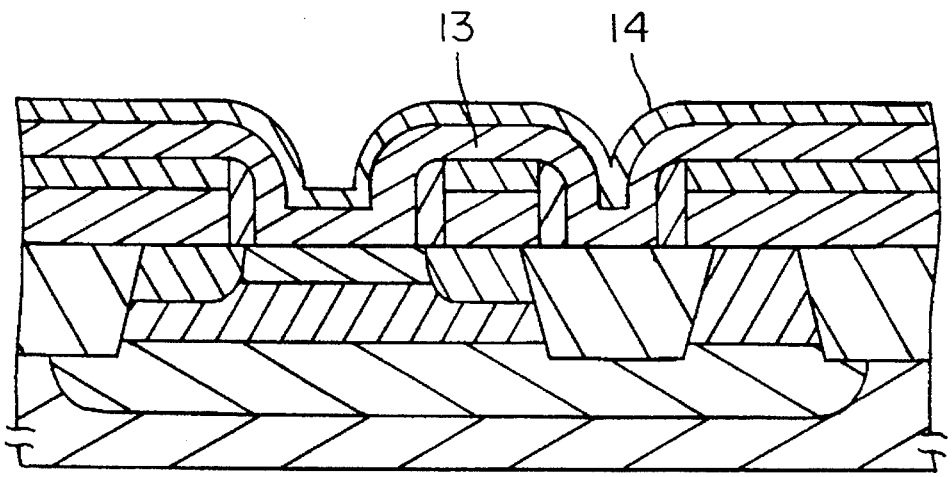

In the next step, as shown in FIG. 2(c), a silicon dioxide film 14 as of 2 to 3 nm thick is formed on the surface of the n type polysilicon film 13. This silicon dioxide film 14 is such as an oxide film occurring of itself in the air when the semiconductor substrate is taken out of the CVD apparatus for the n type polysilicon film 13. That is, a natural oxide film is used. Alternatively it can be produced by heating at 600° to 650° C. for a few minutes in $N_2$ gas atmoshpere containing $O_2$ at 1% at operating pressures of 0.1–1 Torr. The silicon dioxide film 14 has a thickness of preferably 5 nm or less because of keeping the electric resistance small.

Figure 2D:
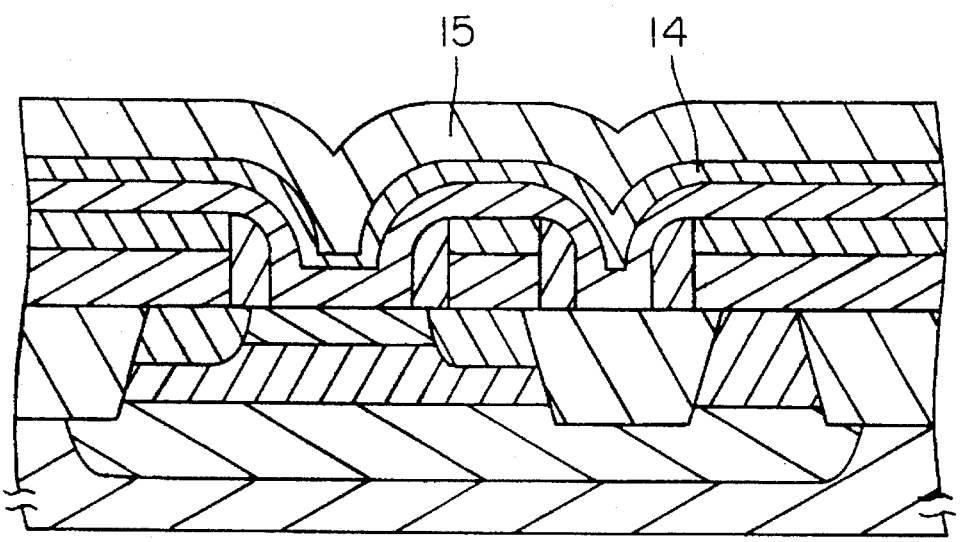

In the next step, as shown in FIG. 2(d), a polysilicon film 15 is deposited to a thickness of 150 to 200 nm by CVD technique without adding any impurity, and then doped with arsenic by ion implantation to obtain an $n^+$ type polysilicon film 15 of about $5\times10^{19}$ to $10^{20}$ atoms/cm$^3$ in impurity concentration. The ion implantation can be accomplished under the conditions of doping level: such as $5\times10^{19}$ atom/cm$^2$, implant energy: such as 70 keV, and desired time: about 5 minutes.

Figure 2E:
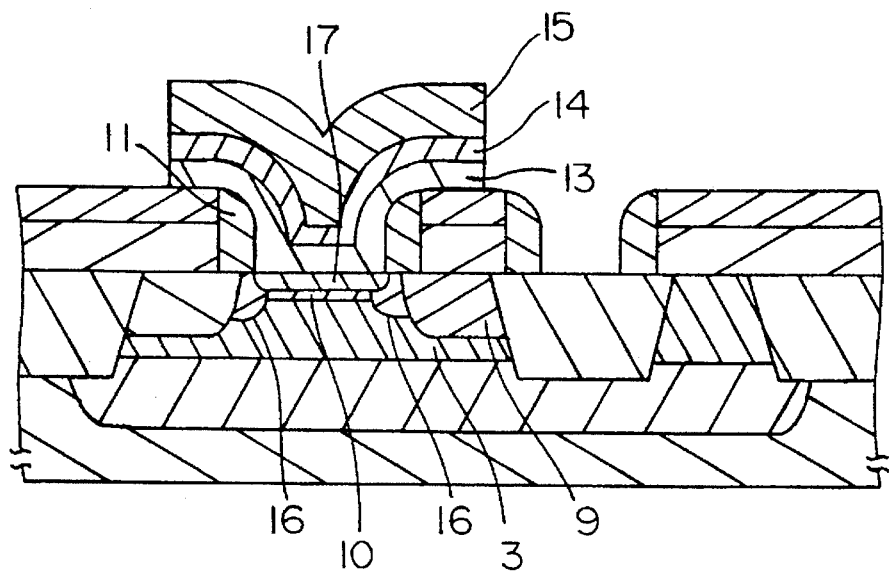

Using photolithography and dry etching, as shown in FIG. 2(e), the $n^+$ type polysilicon film 15, the silicon dioxide film 14, and the $n^{++}$ type polysilicon film 13 are patterned in sequence. The subsequent rapid thermal annealing (RTA) effects diffusion of boron and arsenic each from the insulating sidewall-film 11 and the $n^+$ type polysilicon film 13, respectively, and whereby $p^+$ type base and $n^+$ type emitter regions 16 and 17 are formed. The RTA can be carried out in $N_2$ gas atmosphere at 1000° C. for 10 to 20 seconds of annealing time.

Figure 2F:
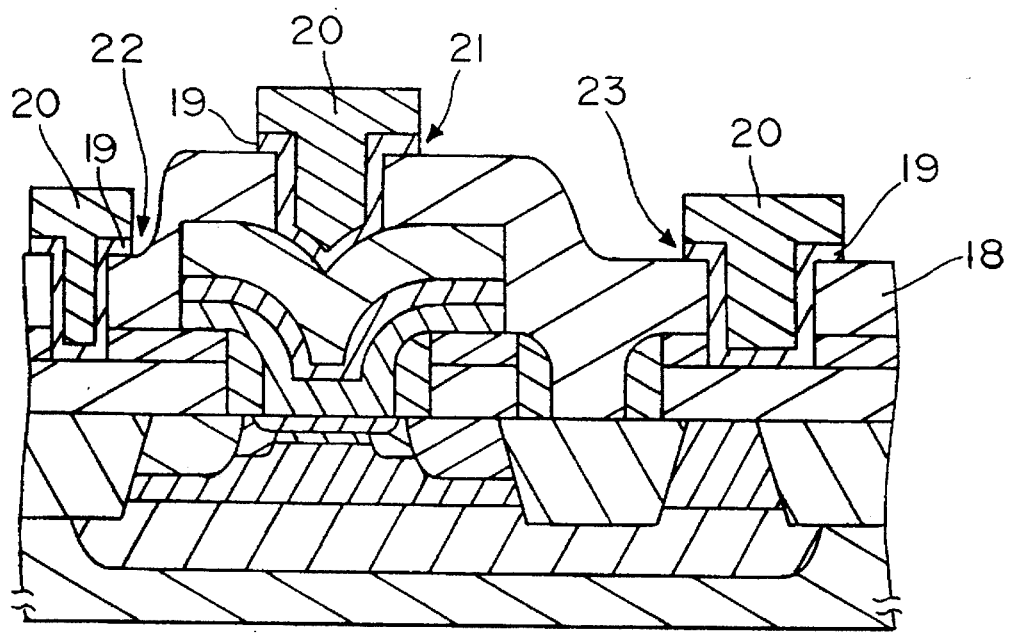

FIG. 2(f) shows that over the entire surface, a silicon dioxide film 18 is formed, in which contact holes are opened to expose the $n^+$ type polysilicon film 15, the p type polysilicon film 6, and the n type polysilicon film 7. After a depositing titanium nitride film 19 and then an aluminum film 20 by the sputtering technique, patterning is performed by the combined use of photolithography and dry etching to fabricate emitter, base and collector electrodes 21, 22 and 23, respectively.

According to this embodiment, in the place of an n type polysilicon film, there is built on the base region a structure comprising the $n^{++}$ type polysilicon film 13, the $n^+$ type polysilicon film 15, and the thin silicon dioxide film 14 interposed between them. Therefore, sufficient n type impurity for forming the emitter region 17 can be diffused from the $n^{++}$ type polysilicon film 13, which in turn enables forming an emitter region 17 having a uniform (horizontally to the semiconductor substrate 1) distribution of impurity concentration, at the emitter-opening 11 bottom in the base region. The $n^+$ type polysilicon film 15 is lower in impurity concentration than the $n^{++}$ type polysilicon film 13, which makes it possible to open the contact hole in the insulating film 18 covering the $n^{++}$ type polysilicon film 15, at a sufficient etch selectivity in respect to the insulating film 18. This allows forming the emitter electrode 21 without etching the polysilicon film and without producing any alloy spiking. The procedure of depositing the $n^+$ polysilicon film 15 is performed without addition of any impurity, and then introducing an n type impurity can be accomplished in a shortened time as compared with the procedure running with the addition of impurity. Besides the thin silicon dioxide 14 film between the $n^{++}$ and $n^+$ polysilicon films 13 and 15 prevents impurities in them from interdiffusing between them, with the results of permitting them to play their roles at most, and hence of obtaining simultaneously the above-mentioned effects. Since the silicon dioxide film 14 formed between the polysilicon films 13 and 15 is very thin, an emitter current necessary for driving the transistor flows therethrough with preventing the interdiffusion of impurities between $n^{++}$ and $n^+$ polysilicon films 13 and 15.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. For example, in the process of building the device on the semiconductor substrate, after the step of forming the silicon dioxide film 14, an arsenic-polysilicon film of 190 nm thick and low in arsenic concentration of about $5\times10^{19}$ cm$^{-3}$ is formed, and the subsequent steps till the patterning for fabricating a emitter is carried out in the same way as in the above-described embodiment. By this way, in virtue of the arsenic-polysilicon film low in arsenic concentration, instead of the $n^{30}$ type polysilicon film 15, the electric resistance of the emitter can be further reduced. It is therefore contemplated that the appended claims will cover any modifications or embodiments as fall within the scope of the invention.

What is claimed is:

1. A method of fabricating a semiconductor device comprising the steps of:

forming a base region of a first conductivity type in a collector region of a second conductivity type;

forming a first polysilicon film on a surface of said base region while doping an impurity of said second conductivity type into said first polysilicon film;

forming an insulating film on a surface of said first polysilicon film;

forming a second polysilicon film of the second conductivity type on a surface of said insulating film an impurity concentration of said second polysilicon film being lower than that of said first polysilicon film; and forming an emitter region into said base region by diffusing an impurity contained in said first polysilicon film from said first polysilicon film into said base region.

2. A method of fabricating a semiconductor device according to claim 1, wherein the impurities in said first and second polysilicon films are prevented by said insulating film from interdiffusing therebetween.

3. A method as claimed in claim 1, wherein said insulating film is a silicon oxide film.

4. A method of fabricating a semiconductor device comprising the steps of:

forming a base region of a second conductivity type in a collector region of a first conductivity type;

forming a first polysilicon film on a major surface of said base region while doping an impurity of said first conductivity type into said first polysilicon film;

forming a silicon dioxide film on a surface of said first polysilicon film;

forming a second polysilicon film of the first conductivity type lower in impurity concentration than said first polysilicon film on a major surface of said silicon dioxide film;

forming an emitter region of said first conductivity type by diffusing an impurity of said first conductivity type from said first polysilicon film into said base region;

forming an insulating film covering said second polysilicon film; and a step of, after opening a contact hole in said insulating film, forming an emitter electrode filling said contact hole and connected to said second polysilicon film.

5. A method of fabricating a semiconductor device comprising the steps of:

forming a base region of a first conductivity type in a collector region of a second conductivity type;

forming a first polysilicon film on a surface of said base region while doping an impurity of said second conductivity type into said first polysilicon film;

forming a second polysilicon film of said second conductivity type over a said first polysilicon film; and performing heat treatment for diffusing an impurity of said second conductivity type from said first polysilicon film to said base region in order to form an emitter region of said second conductivity type in said base region.

6. The method of fabrication a semiconductor device as claimed in claim 5, wherein a silicon oxide film having thickness equal to or less than 5 nm is inserted between said first and second polysilicon films.

7. The method of fabricating a semiconductor device as claimed in claim 5, wherein impurity concentration of said upper polysilicon film is smaller than that of said lower polysilicon film.

8. The method of fabrication a semiconductor device as claimed in claim 7, wherein a silicon oxide film having thickness equal to or less than 5 nm is inserted between said first and second polysilicon films.

9. A method of fabricating a semiconductor device comprising the steps of:

forming a base region of a first conductivity type in a collector region of a second conductivity type;

covering said base region with a first insulating film having a first contact hole exposing a part of said base region;

forming a polysilicon film on surfaces of said first insulating film and said part of said base region while doping an impurity of said second conductivity type into said polysilicon film to thereby form a first impurity-doped polysilicon film;

forming a second insulating film on a surface of said first polysilicon film;

forming a second impurity-doped polysilicon film of said second conductivity type on a surface of said second insulating film, said second impurity-doped polysilicon film having an impurity concentration lower than that of said first polysilicon film;

diffusing an impurity contained in said first impurity-doped polysilicon film into said base region to form an emitter region in said base region;

patterning said second impurity-doped polysilicon film, said second insulating film and said first impurity-doped polysilicon film to form an emitter electrode, said emitter electrode being thereby composed of a portion of said first impurity-doped polysilicon, a portion of said second insulating film and a portion of said second impurity-doped polysilicon film, said portion of said second insulating film preventing said portion of said first impurity-doped polysilicon film from being in direct contact with said portion of said second impurity-doped polysilicon film and having such a thickness that allows a current to flow therethrough between said portion of said first impurity-doped polysilicon film and said portion of said second impurity-doped polysilicon film;

covering said emitter electrode with a third insulating film;

selectively removing said third insulating film to form a second contact hole in said third insulating film, said second contact hole exposing a part of said portion of said second impurity-doped polysilicon film of said emitter electrode; and forming a metal electrode in contact with said part of said portion of said second impurity-doped silicon film through said second contact hole.

10. The method as claimed in claim 9, wherein said second insulating film is made of silicon oxide and has a thickness equal to or less than 5 nm.

11. The method as claimed in claim 10, wherein said second impurity-doped polysilicon film is formed by depositing a polysilicon film and then doping an impurity into said polysilicon film.

* * * * *